United States Patent
Wang et al.

(10) Patent No.: US 9,528,820 B2
(45) Date of Patent: Dec. 27, 2016

(54) SYSTEM AND METHOD FOR USING A LINEAR POLARIZER TO REDUCE OPTICAL CROSSTALK FOR OPTICAL PROXIMITY SENSORS

(75) Inventors: Yu Wang, Plano, TX (US); Kerry Glover, Rockwall, TX (US); David Mehrl, Plano, TX (US); Greg Stoltz, Flower Mound, TX (US); Tom Dunn, Dallas, TX (US)

(73) Assignee: AMS AG, Unterpremstaetten (AT)

( * ) Notice: Subject to any disclaimer, the term of this patent is extended or adjusted under 35 U.S.C. 154(b) by 116 days.

(21) Appl. No.: 14/124,235

(22) PCT Filed: Jun. 6, 2012

(86) PCT No.: PCT/EP2012/060760
§ 371 (c)(1),
(2), (4) Date: Mar. 24, 2014

(87) PCT Pub. No.: WO2012/168333
PCT Pub. Date: Dec. 13, 2012

(65) Prior Publication Data
US 2014/0197306 A1 Jul. 17, 2014

Related U.S. Application Data

(60) Provisional application No. 61/495,215, filed on Jun. 9, 2011.

(51) Int. Cl.
*G01B 11/14* (2006.01)
*H03K 17/94* (2006.01)
(52) U.S. Cl.
CPC ............. *G01B 11/14* (2013.01); *H03K 17/941* (2013.01); *H03K 2217/94108* (2013.01)
(58) Field of Classification Search
CPC .... H03K 17/94; H03K 17/941; H03K 17/945; H03K 2217/94108; H03K 2217/9455; G01B 11/14
See application file for complete search history.

(56) References Cited

U.S. PATENT DOCUMENTS 5,587,816 A * 12/1996 Gunjima ............... F21V 9/14
349/113
5,963,280 A * 10/1999 Okuda ................. G01C 21/365
349/64

(Continued)

FOREIGN PATENT DOCUMENTS

| DE | 4115013 C1 | 5/1992 |
| DE | 20221470 U1 | 3/2006 |
| EP | 0446642 A1 | 9/1991 |

OTHER PUBLICATIONS

Kozol, E. T., "Optical Sensor" IBM Technical Disclosure Bulletin, Jun. 1984, pp. 461, vol. 27 No. 1B.

(Continued)

*Primary Examiner* — John Lee
(74) *Attorney, Agent, or Firm* — McDermott Will & Emery LLP

(57) ABSTRACT

An optical proximity sensor often emits light, and detects the photons in the returned light signal. Because light can be reflected and scattered by cover glass and ink layer printed on the cover glass, optical crosstalk is a concern for the optical proximity sensors. In one embodiment, the present disclosure provides an optical proximity sensor including a linear polarizer to cover the photo detector, or a polarizer to cover the light emitting device, or two polarizers to cover both the photo detector and the light emitting device. The polarizer blocks the s-polarized light and only allows the p-polarized light to pass through. Because the scattered light is predominated by the s-polarization, the optical crosstalk may be reduced.

10 Claims, 5 Drawing Sheets

(56) References Cited

U.S. PATENT DOCUMENTS

Figure 1:
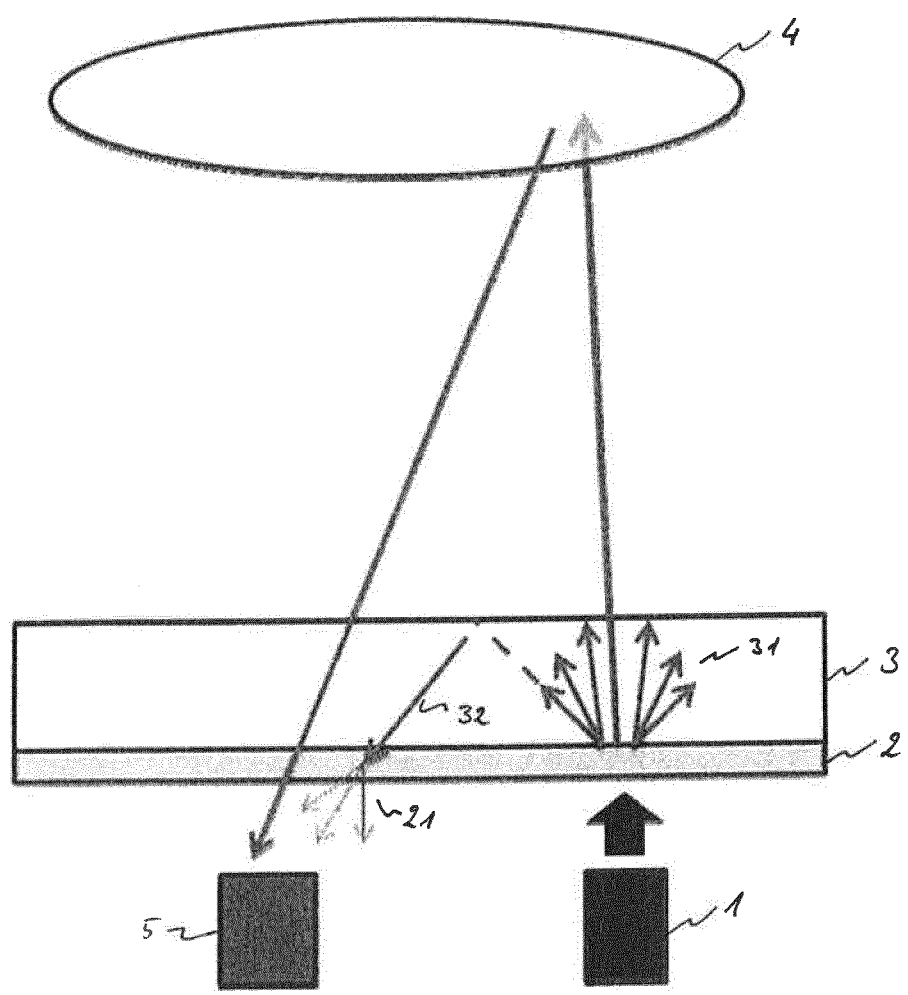

| | | | | |
|---|---|---|---|---|
| 6,144,424 | A * | 11/2000 | Okuda | G01C 21/365 349/11 |
| 7,278,624 | B2 * | 10/2007 | Iott et al. | 251/129.04 |
| 7,297,937 | B2 | 11/2007 | Charrier et al. | |
| 8,567,955 | B2 * | 10/2013 | Amm | G06F 1/1605 348/207.1 |
| 8,624,846 | B2 * | 1/2014 | Fukunaga | G02F 1/13338 345/156 |
| 8,915,596 | B2 * | 12/2014 | Amm | G06F 1/1605 348/207.1 |
| 2004/0005451 | A1 * | 1/2004 | Kretman | C08J 5/18 428/317.9 |
| 2006/0237674 | A1 * | 10/2006 | Iott et al. | 251/129.04 |
| 2008/0006762 | A1 | 1/2008 | Fadell et al. | |
| 2009/0087192 | A1 * | 4/2009 | Leard et al. | 398/152 |
| 2009/0146992 | A1 * | 6/2009 | Fukunaga | G02F 1/13338 345/214 |
| 2011/0121181 | A1 * | 5/2011 | Costello et al. | 250/338.1 |
| 2011/0122091 | A1 | 5/2011 | King et al. | |
| 2011/0133941 | A1 * | 6/2011 | Yao et al. | 340/600 |
| 2012/0062364 | A1 * | 3/2012 | Rowe et al. | 340/5.82 |
| 2012/0170284 | A1 * | 7/2012 | Shedletsky | 362/355 |
| 2012/0223231 | A1 * | 9/2012 | Nijaguna | 250/338.1 |
| 2012/0243091 | A1 * | 9/2012 | Amm | G06F 1/1605 359/489.07 |
| 2014/0197306 | A1 * | 7/2014 | Wang et al. | 250/221 |

OTHER PUBLICATIONS

Strack, Charles, "New photoelectric and proximity sensors are smaller, more versatile", Omron Electronics Inc., Nov. 1986, pp. 71-74, vol. 59 No. 12, I. & C.S., Radnor, USA.

* cited by examiner

Figure 4
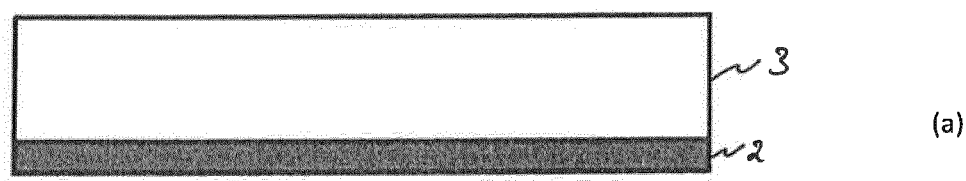
(a)
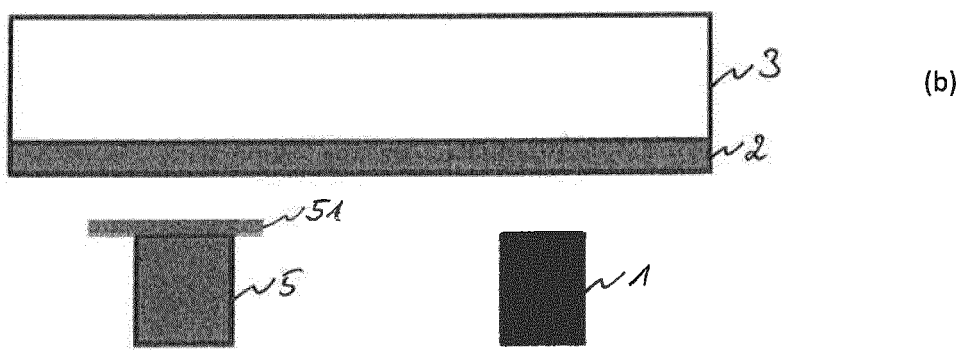
(b)
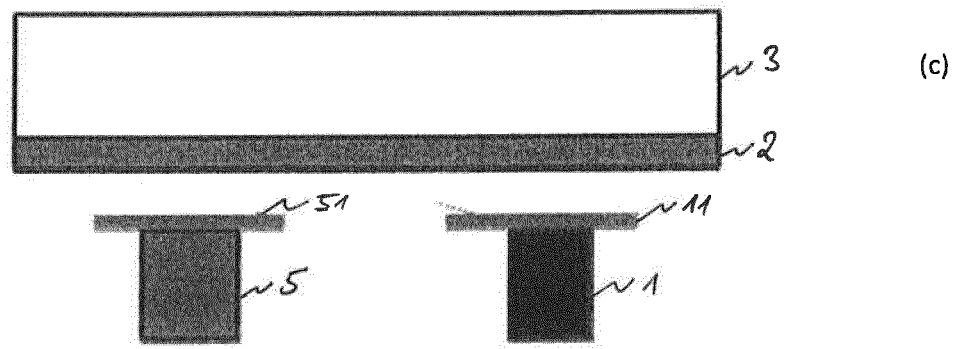
(c)

SYSTEM AND METHOD FOR USING A LINEAR POLARIZER TO REDUCE OPTICAL CROSSTALK FOR OPTICAL PROXIMITY SENSORS

DESCRIPTION

The invention relates to a device for detecting a proximity target, and more specifically to an active optical proximity sensor which employs light emitting diodes (LED) and photo detectors.

An optical proximity sensor is an active sensor able to detect the presence of nearby objects without any physical contact. An optical proximity sensor often emits (visible or IR) light, and detects the photons in the returned light signal. Because the light emitting device and the photo detector are usually adjacent to each other and the light usually has to pass a cover glass (or cover plastic) with ink print on it, light may get reflected by the glass cover and scattered by the ink, optical crosstalk is big concern for optical proximity sensors.

It is an objective of this invention to provide an optical proximity sensor with reduced optical crosstalk.

This objective is achieved by the subject matter of the independent claims. Further embodiments and developments are subject matter of dependent claims.

According to an aspect of the invention an optical proximity sensor comprises a light emitting device, a photon detecting device, a polarization selection device, a transparent cover and an ink layer on the transparent cover.

According to another aspect of the invention the light emitting device is a light emitting diode (LED).

According to another aspect of the invention the photo detecting device is a photodiode.

According to another aspect of the invention the polarization selection device is a linear polarization sheet.

According to another aspect of the invention the polarization selection device is a wire grid polarizer.

According to another aspect of the invention the polarization selection device is orientated in such a direction that only the p-polarized light is allowed to pass through and the s-polarized light will be blocked.

According to another aspect of the invention the transparent cover is a glass plate.

According to another aspect of the invention the transparent cover is a plastic plate.

According to another aspect of the invention the polarization selection device is mounted between the photon detecting device and the ink layer.

According to another aspect of the invention the polarization selection device is mounted between the LED and the ink layer.

According to another aspect of the invention the edge of the LED beam incidents upon the transparent cover/air at an angle close to the Brewster angle.

In one embodiment, the present disclosure provides an optical proximity sensor including a polarizer or polarizers to cover the photo detector, or to cover a LED or to cover the both. The polarizer blocks s-polarized light and let p-polarized light to pass through. Because the scattered light and the reflected light are predominately s-polarized, the optical crosstalk may be reduced.

In another embodiment, optical proximity sensors usually include a light emitting device (for example, a LED or a laser), a photo detector (for example, a photodiode), a transparent protection cover (for example, a glass plate or a plastic plate) and an ink layer printed on the protection cover. Because light gets reflected by air/glass (or air/plastic) interface, and gets scattered by the ink layer, optical crosstalk is a problem for the optical proximity sensors. Physics tells us, if light scattering can be described by dipole scattering, then the scattered light will be predominated by a polarization perpendicular to the light travelling direction, in talking of proximity sensor situation, the scattered light is predominated by s-polarized light. And also, the reflection at glass (plastic)/air Interface is polarization dependent, the s-polarized light gets more reflection than the p-polarized light.

In another embodiment, the present disclosure is an optical proximity sensor including a polarizer to cover the photo detector, or a polarizer to cover the LED or two polarizers to cover both the photo detector and the LED. The polarizer blocks s-polarized light and let p-polarized light pass through. In addition, the geometry between the LED, the photodiode and the cover glass are set in such geometry that the edge of the LED beam incident upon the glass/air interface at an angle close to the Brewster angle. Because the scattered light and the reflected light are predominately s-polarized, the optical crosstalk may be reduced.

In another embodiment, the present disclosure provides an optical proximity sensor including a LED, a photodiode, and a polarizer to cover the photodiode, or a polarizer to cover the LED or two polarizers to cover both the photodiode and the LED and may greatly reduce the optical crosstalk of the optical proximity sensor.

In the following, the principle presented above is described in further detail by means of drawings, in which exemplary embodiments are presented. Like reference numerals designate corresponding similar parts or elements.

Figure 2:
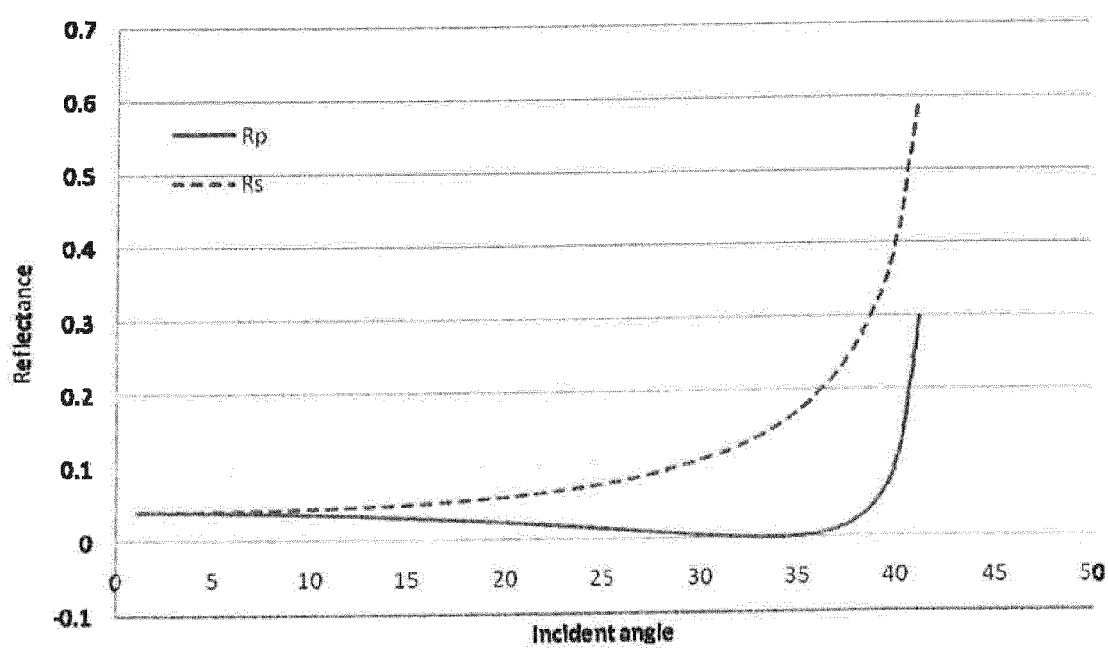
Figure 3:
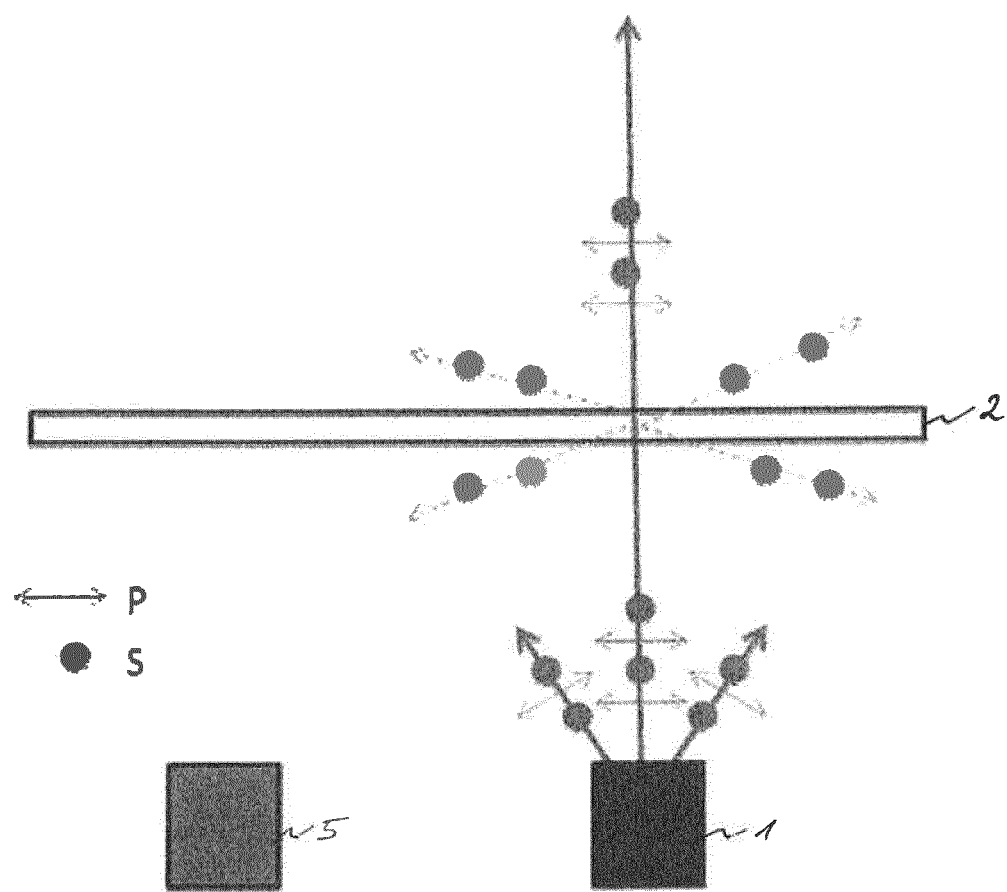
Figure 5:
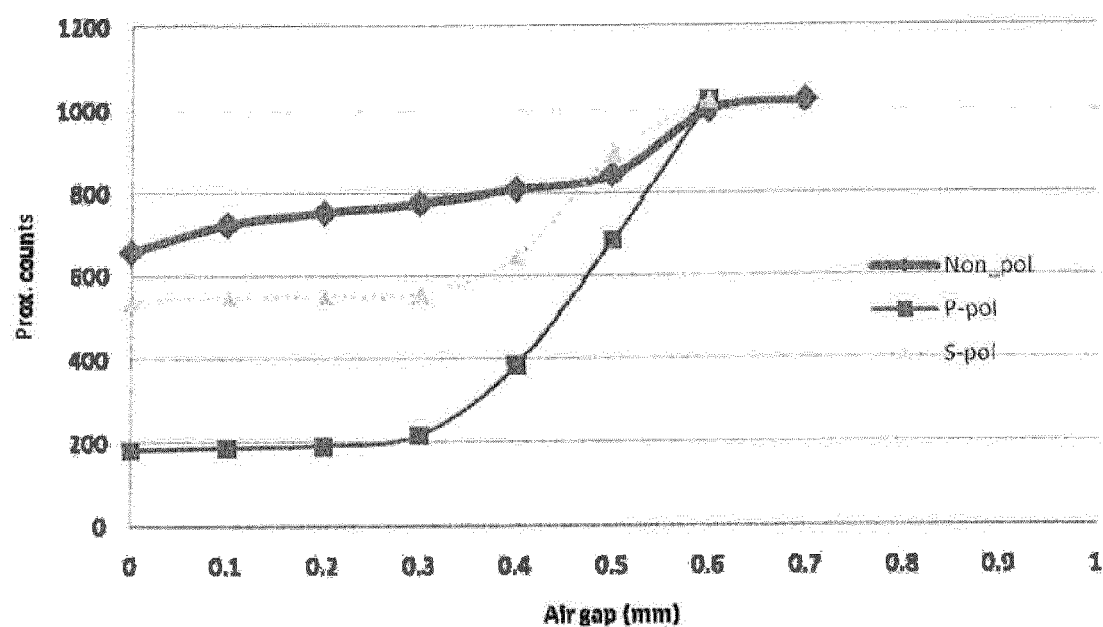

FIG. 1 is diagrammatic representation of a conventional optical proximity sensor wherein light emitted from a LED is scattered by an ink layer, reflected by the top of a glass/air Interface, scattered by the ink again, and enters a photodiode, FIG. 2 shows light reflection at glass/air Interface wherein the reflection of the p-polarized light (Rp) is always less than the reflection of the s-polarized light (Rs). At the Brewster angle, the p-polarized light has no reflection. Inside the glass, the Brewster angle is about 33°, FIG. 3 shows polarization of light scattering by the ink layer of an optical proximity sensor. According to the harmonic oscillator model, the scattered light is predominantly s-polarized, FIG. 4 is a diagrammatic representation of different embodiments as illustrated in three different structures (a), (b), (c) and FIG. 5 shows experimental results of optical crosstalk with different polarization.

The structure of a typical optical proximity sensor is shown in FIG. 1. A LED 1 emits light, the light passes through an ink layer 2 and a cover glass 3, hits an object 4. The object scatters light, and partial of the scattered light goes backward, passes through the cover glass and the ink, and finally reaches a photodiode 5.

Optical crosstalk is usually a problem for this structure of optical proximity sensors. Because the ink scatters light (see arrows 31), the scattered light gets reflected by the top glass/air interface (see arrows 32), and reaches the ink and get scattered again (see arrows 21). The second scattering processes can generate photons that directly hit the photodiode and optical crosstalk occurs.

To generate optical crosstalk, the light usually has to be scattered twice by the ink layer 2 and reflected once at the glass/air interface 3. Analysis shows both the reflected light and the scattered light are polarization dependent.

At an interface of two transparent media, the p-polarized light (polarization in the incident plane) always has less reflection than the s-polarized light (polarization perpendicular to the incident plane). At a special angle known as Brewster angle, no p-polarized light is reflected at the surface, and all reflected light is s-polarized. FIG. 2 shows theoretical calculation of reflection at air/glass Interface, we can see the p-polarized light (Rp) always has lower reflectance than the s-polarized light (Rs), and at the Brewster angle, that is about 33° inside the glass, the reflectance is zero, only the s-polarized light gets reflected. The Brewster angle in the air side is about 57°.

In many materials, light scattering can be described by a harmonic oscillator of bound electrons model. This model indicates, bound electrons have a resonance frequency, if frequency of incident light is much lower than the resonance frequency, the light scattering can be described as the Rayleigh scattering model; if frequency of incident light is much higher than the resonance frequency, the bound electrons can be treated as free electrons, and the light scattering can be described as the Thomson scattering model; if the frequency of the incident light is close to the resonance frequency, the light scattering can be described as near resonance scattering model.

In all of the three models, the Rayleigh scattering model, the Thomson scattering model and the near resonance scattering model, the scattered light is polarized, the scattered light polarization is perpendicular to the direction of the incident light propagation. For our optical proximity sensor, the scattered light is s-polarized as shown in FIG. 3.

Three different embodiments are provided as different structures as shown in FIG. 4(*a*)-(*c*). A polarizer sheet 11, 51 is used to cover the photodiode 5, or the LED 1 or both. To minimize the optical crosstalk, the distance between the LED 1 and the photodiode 5 and the distance between the LED 1 and the glass 3 are chosen in such way, that the edge of the LED beam will incident the top air/glass Interface at an angle close to Brewster angle.

FIG. 4(*a*) shows the first structure, the LED of a proximity sensor is covered by a polarizer 11; this polarizer 11 blocks s-polarized light and allows p-polarized light to pass through. Only the p-polarized light reaches the ink 2, the scattering is greatly reduced because of the lack of s-polarized light. When the light incidents upon the air/glass Interface, because the light is mainly p-polarized and the incident is close to the Brewster angle, most of the light passes through, only a small portion of the light is reflected. The reflected light is again scattered by the ink 2. Because the p-polarized light has little scattering, the optical crosstalk signal reaches the photodiode 5 is reduced. The disadvantage of structure is that light scattering is a complex process, polarization of light may change during the scattering. This means, the p-polarized light, generated by LED 1 and the polarizer mounted 11 on LED may generate some weak s-polarized light when the light is scattered by the ink. This weak s-polarized light may enter the photodiode 5 to generate some optical crosstalk.

FIG. 4(*b*) shows the second structure, the photodiode 5 of a proximity sensor is covered by a polarizer 51, this polarizer blocks s-polarized light and allow p-polarized light to pass through. When the light emitted by the LED incidents on the ink 2, the ink generates scattering, this scattering is dominated by s-polarized light. The s-polarized light is reflected by the air/glass interface and incident again on the ink 2. The ink scatters the light again, and the scattered light is still predominately s-polarized. The polarizer 51 on top of the photodiode 5 blocks the s-polarized light, only the p-polarized light reflected by the object 4 (not shown) can reach the photodiode 5. Because the s-polarized scattered light is blocked, the optical crosstalk is greatly reduced. This structure should have better crosstalk reduction than the first structure.

FIG. 4(*c*) shows the third structure, both of the LED 1 and the photodiode 5 of an optical proximity sensor are covered by polarizer 11, 51. Also, the polarizer blocks s-polarized light and allow p-polarized light to pass through. Non-polarized light emitted from LED becomes p-polarized due to the polarizer mounted on top of LED 1. The p-polarized light has little scattering by the ink 2. When the light incidents upon the air/glass interface, because the light is p-polarized and the incident is close to the Brewster angle, most of the light passes through, only a small portion of the light is reflected. The reflected light is still predominately p-polarized, it again incidents on the ink 2, a small amount of the s-polarized light may generated by scattering. Since the polarizer on top of the photodiode 5 blocks the s-polarized light, only the p-polarized light can reach the photodiode 5, the optical crosstalk is greatly reduced. This structure will have the lowest optical crosstalk among the three structures. The disadvantage of structure is that the light has to go through the polarizer twice, and scattering from the object 4 may change the polarization of the light, this may reduce intensity of the returned light signal reaches the photodiode 5.

FIG. 5 shows the experimental results of optical crosstalk with different light polarization. A polarizer sheet 11, 51 was used to cover both of the LED 1 and the photodiode 5. The x-axis is the air gap between the ink and the photodiode, and the y-axis is the optical crosstalk (in proximity sensor digital counts). For less than 0.3 mm air gap, without polarizer, the optical crosstalk is close to 800 counts as shown in the heavy line in the graph. When we insert a polarizer, in a direction that only p-polarized light can pass through, the optical crosstalk drops to less than 200 counts as shown in the light line in the graph. Then when we rotate the polarizer 90°, now the polarized light is blocked and only the s-polarized light can pass through, the optical crosstalk increases to near 600 counts as shown in the dotted line in the graph.

REFERENCE NUMERALS

1 light emitting diode
11 polarizer
2 ink layer
21 scattering
3 cover glass
31 scattering
32 reflected light
4 object
5 photodiode
51 polarizer
Rp p-polarized light
Rs s-polarized light
p p-polarization
s s-polarization

The invention claimed is:
1. An optical proximity sensor, comprising:
a light emitting device;
a photon detecting device;
a first polarization selection device and a second polarization selection device;
a transparent cover; and an ink layer on the transparent cover,
wherein the first polarization selection device is mounted between the photon detecting device and the ink layer,
wherein the second polarization selection device is mounted between the light emitting device and the ink layer,
wherein each of the first polarization selection device and the second polarization selection device is configured to block polarization originating from scattering induced by the ink layer on the transparent cover, and
wherein each of the first polarization selection device and the second polarization selection device is configured to block s-polarized light and pass p-polarized light.

2. The proximity sensor according to claim 1, wherein the light emitting device is a light emitting diode.

3. The proximity sensor according to claim 1, wherein the photo detecting device is a photodiode.

4. The proximity sensor according to claim 1, wherein each of the first polarization selection device and the second polarization selection device is a linear polarization sheet.

5. The proximity sensor according to claim 1, wherein each of the first polarization selection device and the second polarization selection device is a wire grid polarizer.

6. The proximity sensor according to claim 1, wherein each of the first polarization selection device and the second polarization selection device is orientated in a direction such that only the p-polarized light is allowed to pass through and the s-polarized light will be blocked.

7. The proximity sensor according to claim 1, wherein the transparent cover is a glass plate.

8. The proximity sensor according to claim 1, wherein the transparent cover is a plastic plate.

9. The proximity sensor according to claim 1, wherein an edge of a beam from the light emitting device incidents upon the transparent cover/air at an angle close to the Brewster angle.

10. An optical proximity sensor, comprising:
a light emitting device;
a photon detecting device;
a first polarization selection device and a second polarization selection device;
a transparent cover; and
an ink layer on the transparent cover,
wherein the first polarization selection device is mounted between the photon detecting device and the ink layer,
wherein the second polarization selection device is mounted between the light emitting device and the ink layer,
wherein a distance between the light emitting device and the photon detecting device and a distance between the light emitting device and the transparent cover are adjusted such that an edge of a beam of light emitted from the light emitting device incidents upon the transparent cover at an angle close to the Brewster angle,
wherein each of the first polarization selection device and the second polarization selection device is configured to block polarization originating from scattering induced by the ink layer on the transparent cover, and
wherein each of the first polarization selection device and the second polarization selection device is configured to block s-polarized light and pass p-polarized light.

\* \* \* \* \*